United States Patent [19]
Berrod et al.

[11] 3,942,181
[45] Mar. 2, 1976

[54] VARIABLE-GAIN AMPLIFIER

[75] Inventors: François Berrod; Fernand Puverel, both of Paris, France

[73] Assignee: Thomson-CSF, Paris, France

[22] Filed: Oct. 19, 1973

[21] Appl. No.: 407,996

[30] Foreign Application Priority Data
Oct. 20, 1972 France .............................. 72.37263

[52] U.S. Cl. .................. 343/16 M; 330/28; 330/86; 330/29; 330/145
[51] Int. Cl.² .......................... G01S 9/22; H03F 1/34
[58] Field of Search .......... 330/29; 145, 28, 144, 86, 330/85; 343/16 M

[56] References Cited
UNITED STATES PATENTS

| | | | |
|---|---|---|---|
| 3,550,028 | 12/1970 | Dilley, Jr. et al. ............... | 330/145 X |
| 3,582,807 | 6/1971 | Addis .................................... | 330/29 |
| 3,624,561 | 11/1971 | Tongue ........................... | 330/145 X |
| 3,708,699 | 1/1973 | Frei et al. ......................... | 330/29 X |
| 3,708,754 | 1/1973 | Diehl ................................. | 330/28 X |
| 3,710,270 | 1/1973 | Addis et al. ........................... | 330/29 |
| 3,723,894 | 3/1973 | Benenati ............................. | 330/29 |
| 3,743,770 | 7/1973 | Vidovic ............................. | 330/29 X |
| 3,774,118 | 11/1973 | Doorn ................................. | 330/28 |

Primary Examiner—T. H. Tubbesing
Assistant Examiner—G. E. Montone
Attorney, Agent, or Firm—Karl F. Ross; Herbert Dubno

[57] ABSTRACT

A variable-gain amplifier comprises a transistor with an emitter connected in a degenerative emitter-follower circuit which includes a PIN diode traversed by a current injector in the form of an operational amplifier, the PIN diode forming part of a negative-feedback path extending from the output to the inverting input of the operational amplifier. To achieve a gain characteristic whose logarithm varies linearly with a control voltage, this control voltage is fed to the same inverting input through an amplifier circuit with an exponential characteristic, including another operational amplifier provided with an input transistor. A temperature-compensating circuit, preceding that input transistor, comprises still another operational amplifier having a further transistor inserted in its negative-feedback path. The variable-gain amplifier may be included in one of two conjugate (sum and difference) channels of a monopulse radar.

10 Claims, 5 Drawing Figures

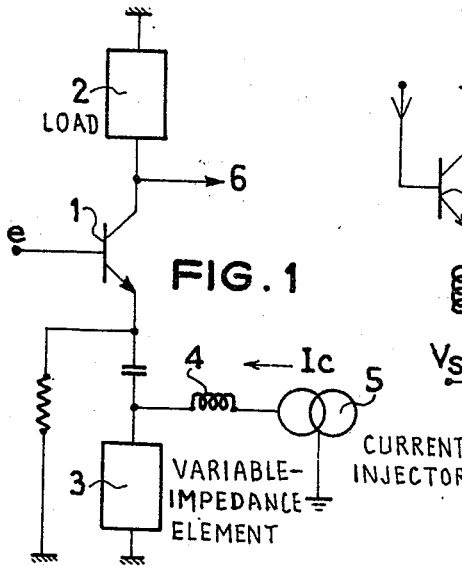
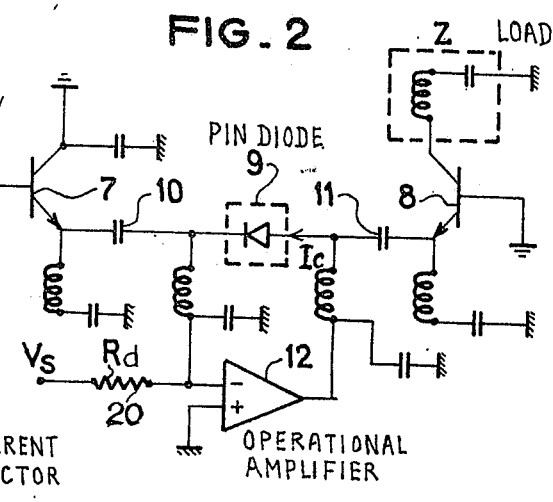
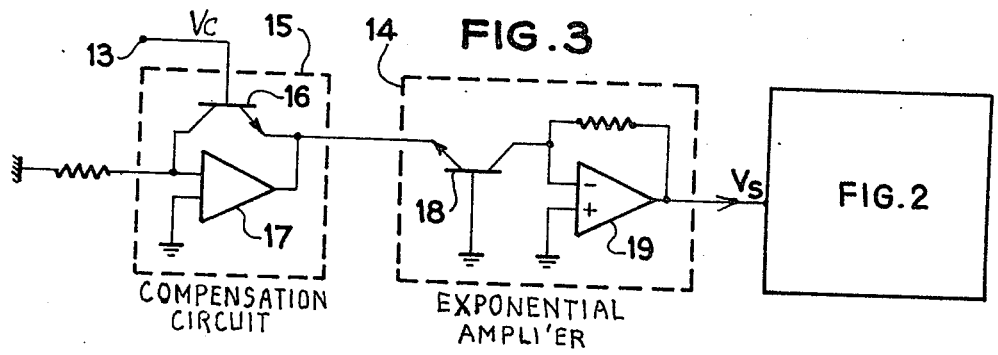
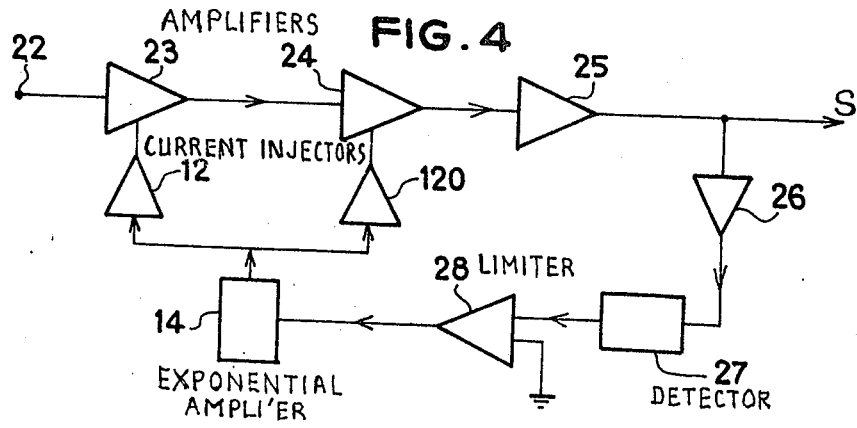

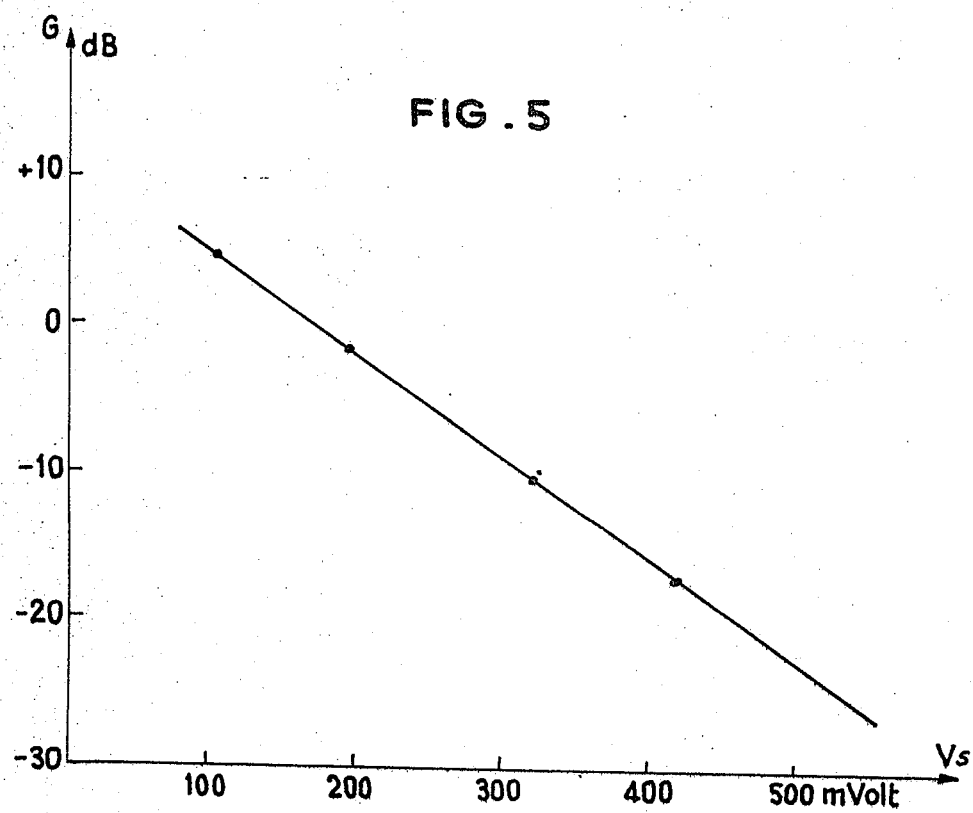

VARIABLE-GAIN AMPLIFIER

BACKGROUND OF THE INVENTION

The present invention relates to improvements in variable-gain amplifiers requiring gain control varying in accordance with a well defined law, e.g., linearly, over a wide dynamic range.

Prior attempts at solving this problem have not turned out satisfactory. Thus, a gain control has been proposed including an attenuator consisting of a fixed impedance and a nonlinear element such as a diode, whose dynamic impedance varies as a function of the direct current flowing through it. Another device utilizes field-effect transistors whose gate voltage is varied. Yet another device of this type comprises a variable-resistance element of the diode type, arranged in a negative-feedback path of the variable-gain amplifier to be controlled.

However, these devices have drawbacks. In particular, the gain varies as a function of the temperature and this militates against good reproducibility. Moreover, the law governing the variation of the logarithm of the gain as a function of the control voltage is not linear and the dynamic range is relatively narrow, thereby severely limiting the usefulness of the controlled amplifier stage.

SUMMARY OF THE INVENTION

The object of the present invention is to overcome these drawbacks and to provide a gain control of wide dynamic range for an amplifier stage, the gain varying in accordance with a readily reproducible characteristic. More specifically, our invention aims at providing a gain characteristic whose logarithm varies linearly with the control voltage.

In accordance with the present invention, a variable-impedance element constituted by a PIN diode is connected in a degenerative or negative-feedback circuit connected to a reference electrode (e.g., emitter) of a transistor, or pair of transistors, included in the controlled amplifier stage, the PIN diode being biased by a current flowing in a negative-feedback path of an operational amplifier supplied at an input thereof with the gain-controlling voltage.

BRIEF DESCRIPTION OF THE DRAWING

The above and other features of our invention will now be described in detail with reference to the accompanying drawing wherein:

FIG. 1 is a circuit diagram of a variable-gain amplifier embodying our invention;

FIG. 2 is a circuit diagram of another embodiment;

FIG. 3 illustrates additional components of a system including the variable-gain amplifier of FIG. 2;

FIG. 4 is a block diagram illustrating the application of our improved variable-gain amplifier to a monopulse radar system; and FIG. 5 is a graph showing the variation of the gain G of the amplifier of FIG. 4 as a function of the applied control voltage.

DETAILED DESCRIPTION

FIG. 1 illustrates schematically an amplifier, or amplifier stage, comprising an element 3 whose impedance varies as a function of the current flowing through it, connected in a negative-feedback circuit in the amplifier stage. This stage, in a manner known per se, comprises a transistor with an emitter-follower connection. The collector of the transistor 1 is connected to a load impedance 2 across the terminals of which the output signal is picked up at 6 in response to an input signal $e$ applied to the base. The emitter of the transistor 1 is grounded for high frequencies through a capacitor in series with the variable-impedance element 3 which is connected, through a surge coil 4, to a current injector 5 which supplies the biasing current $Ic$ for the element 3.

The element 3, whose resistance varies with the current flowing through it, is a PIN (positive/intrinsic/negative) diode.

The characteristics of these diodes are well known, and need only be outlined briefly here. A PIN diode consists of two heavily doped regions, p+ and n+, known as the end regions, separated by a lightly doped intermediate region. When the intermediate region has a substantial thickness (on the order of 10 to 100 microns), the diode acts as a high-voltage rectifier having a low direct-voltage drop for high currents because of the modulation of the conductivity of the intermediate region by the high number of charge carriers injected through the end regions. However, in the very-high-frequency range, a PIN diode of this kind can function as a variable resistor because the frequencies are then too high for the rectification to take place on account of the relatively long recovery time of the intermediate layer.

For zero or reverse bias, the intermediate layer creates a high resistance. Under the effect of forward bias, the injection and storage of charge carriers reduces this resistance in the intermediate region in accordance with the formula $$R \approx \frac{(20-50)}{I^{0.87}}$$

where R is expressed in ohms and $I$ is the forward biasing current expressed in milliamps.

It is in this latter state that the PIN diode is utilized in the system embodying our present invention, where it affords numerous advantages.

The insertion of the variable element in a feedback circuit makes it possible, first of all, to achieve a dynamic range in the variable-gain stage which increases with the input level. In the negative-feedback amplifier, the dynamic-gain variation is limited by the impedance of the electrode to which the variable element is coupled, the electrode in this case being the emitter of the transistor, on the one hand, and by the parasitic capacitances of the circuit, on the other.

For a PIN diode, the charge-carrier life greatly exceeds the cycle length corresponding to the frequency of the signals applied to the amplifier. Thus, by using the PIN diode as a variable element, complete separation between the dynamic and static characteristics of the diode is achieved, that is to say between the dynamic impedance of the diode and its low-frequency impedance. Consequently, with a charge-carrier life on the order of 1.3 microsecond, there is a lower limit on the order of 1 megahertz for the frequency at which the diode will operate as a variable resistor. Likewise, there is an upper limit for the frequency of the diode-biasing current. This makes it possible to achieve very low-distortion amplification since the permissible dynamic current becomes independent of the control current.

Moreover, by connecting the PIN diode in a negative-feedback circuit including a current injector 5, we are able to insure that the current flowing through the diode depends only upon the input voltage of the current injector and this improves the gain control of the amplifier, making it possible to effect better utilization of the wide control range afforded by the emitter-follower connection.

FIG. 2 illustrates another embodiment of the invention, in which the controlled amplifier comprises a differential circuit.

This two-stage amplifier, constructed as an integrated circuit, comprises two transistors 7 and 8 of like conductivity type (NPN) in emitter-follower connection with their emitters interconnected. The element whose resistance varies with the current flowing through it, i.e., the PIN diode 9 is connected in the link between the emitters of the transistors 7 and 8, through the intermediary of respective capacitors 10 and 11; each emitter, moreover, is connected to ground through a surge coil and a decoupling capacitor. It will be observed, too, that the signals processed in this amplifier stage are applied to the base of the transistor 7, the output signals from the amplifier stage being picked up at the collector of the transistor 8 across the terminals of the load Z. The PIN diode 9, connected in a coupling network included in the degenerative emitter-follower circuit of input transistor 7 and inserted between the emitters of the amplifiers 7, 8 also forms part of a negative-feedback circuit associated with an operational amplifier 12 included in the gain control circuit of the amplifier.

The operational amplifier 12 converts a control voltage $V_s$, applied to its inverting input through a resistor 20, into a biasing current $I_c$ acting directly on the PIN diode 9.

The system of FIG. 2 has the advantage, in relation to one with a simple amplifier of the kind shown in FIG. 1, of still further increasing the dynamic range of the signal which the amplifier will be able to handle.

Accordingly, the amplitude of the permissible signal at the amplifier input, that is to say at the base of the transistor 7, increases as the impedance of the diode 9 increases, that is to say as the gain decreases. The variation in gain which it is thus possible to achieve has no effect upon the pass-band characteristics of the amplifier stage, which is determined by the load Z separated from the PIN diode 9 by the transistor 8. As already mentioned, this gain variation is independent of active elements other than the PIN diode 9, the stage gain being given by the ratio of the load resistance Z connected to the collector of the transistor 8, to the dynamic resistance of the PIN diode.

Still better conditions of operation of the controlled amplifier can be obtained in accordance with the invention by modifying the control voltage applied to the input of the operational amplifier 12 which directly controls the current $I_c$ flowing through the PIN diode.

In the introduction to the present specification we have pointed out that the logarithm of the gain of the amplifier stage should vary as a linear function of the control voltage.

This condition is met in accordance with the invention by connecting between a terminal 13 (FIG. 3), receiving the control voltage $V_c$ which determines the gain of the amplifier 7, 8 of FIG. 2, and the operational amplifier 12, acting directly upon the variable-resistance element, an amplifier circuit 14 with an exponential response.

The control voltage $V_c$ appearing at 13 is applied to the exponential amplifier circuit 14 through a compensation circuit 15 comprising a transistor 16 connected in a feedback path between the inverting input and the output of an operational amplifier 17. This latter amplifier, which is of a type well known per se, requires no detailed description, any more than does the operational amplifier 12. The circuit 15 is designed to compensate for the variation in the base-emitter voltage of the transistor 16 as a function of temperature. The current flowing through a grounded-base input transistor 18 of circuit 14, whose collector is connected to inverting input of an operational amplifier 19 thereof, thus varies exponentially with the base-emitter voltage of input transistor 18 which is connected in series-opposed relationship with feedback transistor 16. Consequently, the voltage $V_s$ appearing at the input of the resistor 20 (FIG. 2), connected to the operational amplifier 12, is exponentially related to the voltage $V_c$; the current $I_c$ flowing through the PIN diode 9, which is equal to the quotient of the value $V_s$ divided by the magnitude $R_d$ of resistor 20, varies exponentially with the voltage $V_c$ so that the logarithm of the gain is a linear function of $V_c$. *voltage*

Thus, we have disclosed a variable-gain amplifier controlled by a PIN diode connected to an emitter of a transistor amplifier. Alternatively, the diode could be connected in the collector circuit, without sacrificing the advantages of our invention.

The variable-gain amplifier in accordance with the invention has numerous applications, for example in any controlled-gain amplifier system operating within a frequency range extending from 1MHz to 1GHz, with this both closed-loop operation, where an automatic gain control (AGC) is created, and open-loop operation, using for example time-variable gain (TVG). A particularly significant application, however, is in a three-amplifier system for automatic gain control as applied to the sum and difference channels of a monopulse radar receiver using amplitude processing, in which the quality of exploration depends primarily upon the gains of the three amplifiers being identical throughout the gain-control range.

FIG. 4 schematically illustrates this kind of automatic-gain-control loop, in accordance with the invention, as applied to one of the conjugate (sum and difference) channels comprising two controlled-gain amplifier stages.

The channel in question, which may be the sum channel of a monopulse radar, thus comprises two controlled-gain amplifiers 23 and 24, followed by an amplifier 25 delivering the output of the channel. The output signals are also applied to the gain-control loop of the amplifiers 23 and 24 through an amplifier 26 supplying a detector stage 27 connected to a threshold amplifier or limiter 28 in a circuit whose time constant determines the pass band of the control system. The amplifier circuit 28 is connected to the amplifier circuit 14 of FIG. 3, having an exponential response characteristic, which in turn is connected to two current injectors 12 and 120, that is to say operational amplifiers controlling PIN diodes (not shown here) arranged in a negative-feedback circuit of the controlled variable-gain amplifiers 23 and 24. Identical injectors control the variable-gain amplifiers of the other channel, i.e., of the difference channel.

FIG. 5 illustrates by way of example the attenuation law of the channel described with reference to FIG. 4, i.e., the variation in gain G as a linear function of the control voltage $V_s$.

By way of example, in closed-loop operation, the level may be regulated between 10 and 65 dB per mW in continuous-wave operation or in intermittent operation with pulses on the order of 0.25 microsecond.

It is clear, in the view of the excellent linearity of the impedance variation in the Pin diode as a function of the current flowing through it, that in accordance with the intended applications other laws of variation of the gain control are conceivable. Thus, a $\sin^2 x/x^2$ law may be required if the amplifier is associated for example with a simulator.

What is claimed is:

1. A variable-gain amplifier comprising:
   semiconductor means provided with an input electrode connected to a source of high-frequency signals and with two further electrodes including a reference electrode whose potential relative to that of said input electrode determines the conductivity of said semiconductor means, one of said further electrodes being connected to a load;
   degenerative circuitry connected to said reference electrode for applying thereto a negative-feedback voltage;
   a PIN diode in said degenerative circuitry;
   biasing means for said PIN diode including an operational amplifier provided with an inverting input, a non-inverting input, an output, and a negative-feedback path connected between said output and inverting input thereof, said PIN diode being inserted in said negative-feedback path; and
   a source of gain-controlling voltage connected to one of the inputs of said operational amplifier.

2. A variable-gain amplifier as defined in claim 1 wherein said semiconductor means comprises a first and a second transistor stage each having a base, an emitter and a collector, said input electrode being the base of said first transistor stage, said reference electrode being the emitter of said first transistor stage, said degenerative circuitry forming part of an emitter-follower connection for said first transistor stage and being coupled to the emitter of said second transistor stage, the emitter of said first transistor stage being connected to the load via the emitter and collector of said second transistor stage.

3. A variable-gain amplifier as defined in claim 2 wherein said transistor stages are of the same conductivity type.

4. A variable-gain amplifier as defined in claim 1 wherein said source of gain-controlling voltage comprises an amplifier circuit with an exponential characteristic.

5. A variable-gain amplifier as defined in claim 4 wherein said source of gain-controlling voltage further comprises a temperature-compensating circuit preceding said amplifier circuit.

6. A variable-gain amplifier as defined in claim 5 wherein said amplifier circuit and said temperature-compensating circuit comprise a second and a third operational amplifier, respectively.

7. A variable-gain amplifier as defined in claim 6 wherein said amplifier circuit includes an input transistor connected to said second operational amplifier, said temperature-compensating circuit including a further transistor inserted in a negative-feedback connection of said third operational amplifier, said further transistor being provided with a control-voltage input.

8. A variable-gain amplifier as defined in claim 7 wherein said input transistor and said further transistor are connected in series-opposed relationship.

9. In a monopulse radar having two conjugate channels, the improvement wherein one of said channels includes a variable-gain amplifier comprising:
   semiconductor means provided with an input electrode connected to a source of high-frequency signal and with two further electrodes including a reference electrode whose potential relative to that of said input electrode determines the conductivity of said semiconductor means, one of said further electrodes being connected to a load;
   degenerative circuitry connected to said reference electrode for applying thereto a negative-feedback voltage;
   a PIN diode in said degenerative circuitry;
   biasing means for said PIN diode including an operational amplifier provided with an inverting input, a noninverting input, and output, and a negative-feedback path connected between said output and inverting input thereof, said PIN diode being inserted in said negative-feedback path; and
   a source of gain-controlling voltage connected to one of the inputs of said operational amplifier.

10. The programmable controller as recited in claim 9 in which said scanner circuit includes control means for alternately executing a data output sequence and a data input sequence, said control means being connected to said interrupt means, connected to said data in gate means and connected to said data out gate means, and being operable to enable said interrupt means and said data out gate means during said data output sequence, and to enable said interrupt means and said data in gate means during said data input sequence.

* * * * *